United States Patent [19]
Goto

[11] Patent Number: 5,218,292
[45] Date of Patent: Jun. 8, 1993

[54] APPARATUS FOR INSPECTING INTERNAL CIRCUIT OF SEMICONDUCTOR DEVICE

[75] Inventor: Kaoru Goto, Tokyo, Japan

[73] Assignee: Sigmatech Co., Ltd., Kanagawa, Japan

[21] Appl. No.: 804,779

[22] Filed: Dec. 9, 1991

[51] Int. Cl.$^5$ .................. G01R 31/02; G01R 1/073
[52] U.S. Cl. ........................ 324/158 F; 324/158 P
[58] Field of Search ............... 324/158 P, 158 F, 72.5

[56] References Cited

U.S. PATENT DOCUMENTS

| | | | |
|---|---|---|---|
| 3,537,718 | 9/1970 | Hamilton et al. | 324/158 F |
| 3,970,934 | 7/1976 | Aksu | 324/158 F |
| 4,616,178 | 10/1986 | Thornton, Jr. et al. | 324/158 F |
| 4,667,155 | 5/1987 | Coiner | 324/158 F |
| 4,694,245 | 9/1987 | Frommes | 324/158 F |
| 4,746,861 | 5/1988 | Nesbitt | 324/158 P |
| 4,834,659 | 5/1989 | Mang et al. | 324/158 F |
| 4,841,231 | 6/1989 | Angelucci | 324/158 P |
| 4,935,695 | 6/1990 | Hayes et al. | 324/158 P |
| 4,975,639 | 12/1990 | Hiwada et al. | 324/158 F |

FOREIGN PATENT DOCUMENTS

| | | | |
|---|---|---|---|
| 0260143 | 10/1928 | Japan | 324/158 P |
| 0142477 | 6/1986 | Japan | 324/158 F |
| 2183938 | 6/1987 | United Kingdom | 324/158 F |
| 9006518 | 6/1990 | World Int. Prop. O. | 324/158 F |

Primary Examiner—Ernest F. Karlsen
Attorney, Agent, or Firm—Koda and Androlia

[57] ABSTRACT

An apparatus for inspecting an internal circuit of a semiconductor device is provided, wherein an inspection table having an inspection equipment such as a microscope, a positioner or the like mounted thereon is constructed into a vibration-proof structure. On a frame surrounding a tester is horizontally supported an inspection table through air spring structures arranged on four corners of the frame, so that vibration or shock produced from a floor or the tester may be effectively absorbed by the air spring structures, to thereby be prevented from adversely affecting a semiconductor device to be inspected. Also, the semiconductor device is set on a socket of a socket-equipped board arranged above the tester in a manner to be close proximity to the tester, so that a substantially true signal may be obtained.

9 Claims, 6 Drawing Sheets

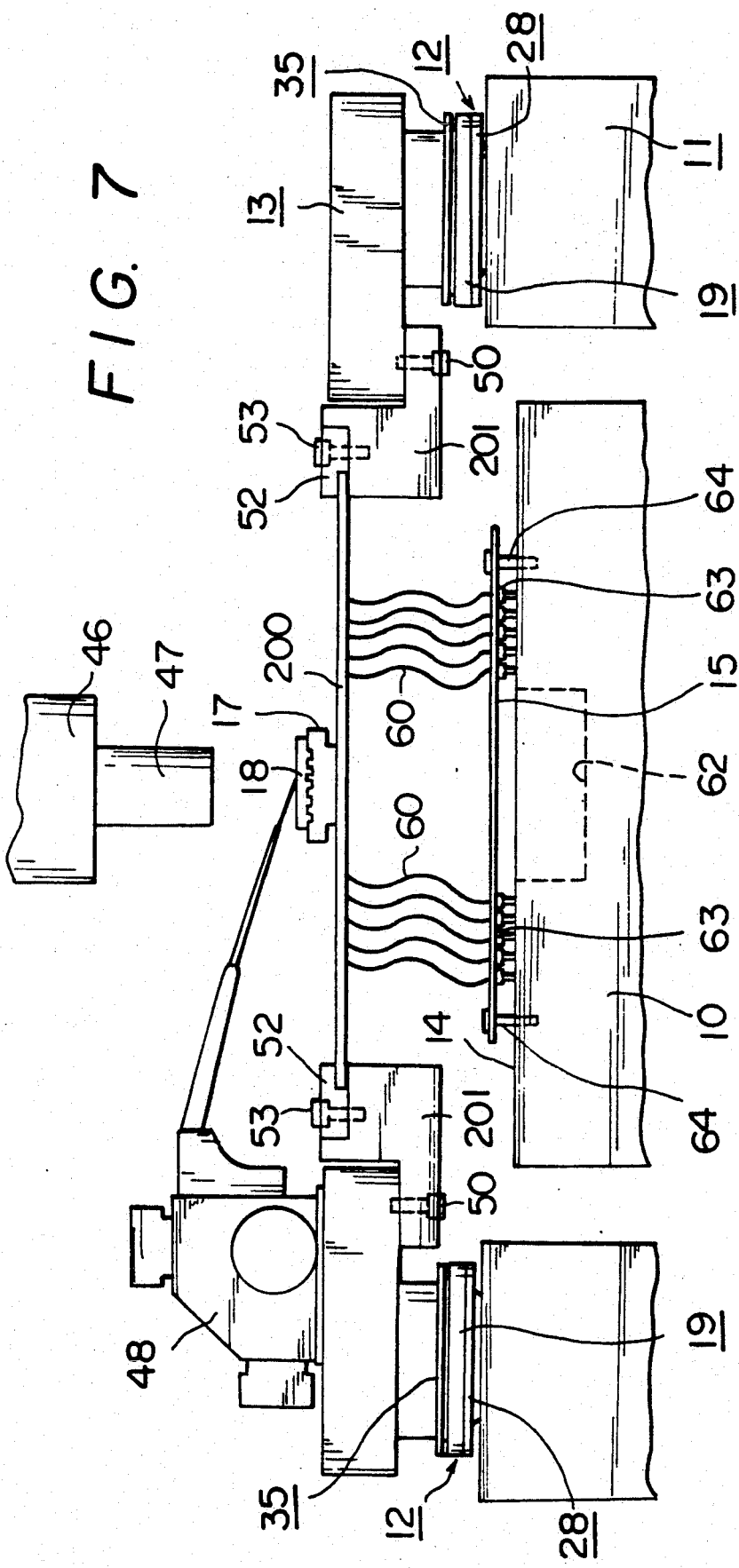

APPARATUS FOR INSPECTING INTERNAL CIRCUIT OF SEMICONDUCTOR DEVICE

BACKGROUND OF THE INVENTION

This invention relates to an apparatus for inspecting an internal circuit of a semiconductor device, and more particularly to an inspecting apparatus for locating or finding out the cause of a failure of an internal circuit of a semiconductor device.

Conventionally, an apparatus for inspecting an internal circuit of a semiconductor device has been used for locating the cause of a failure of a semiconductor device which was found not to meet manufacturing conditions at a development stage, returned because of being defective or found to be defective in a sampling inspection, to thereby improve the manufacturing process of a semiconductor device.

A conventional inspecting apparatus used for this purpose includes an inspection table which is provided with a U-shaped cutout and on which an inspection equipment such as a microscope, a positioner or the like, and a base on which the inspection table is mounted. The base is provided on a portion thereof positionally corresponding to the U-shaped cutout of the inspection table with a movable table, on which an IC socket is positioned for setting thereon a semiconductor device to be inspected. The IC socket is electrically connected through a cable to a tester for operating or examining the semiconductor device to be inspected and the positioner includes an inspection needle for directly probing the internal circuit of the semiconductor device, resulting in the cause of a failure of the semiconductor device being located.

In the conventional inspecting apparatus constructed as described above, the IC socket and tester are interconnected through the cable, resulting in being separated by a significant distance from each other. Unfortunately, this causes a true signal delivered from the tester to be significantly deteriorated through wirings of the IC socket, wirings of the tester or the cable, so that accurate inspection of the semiconductor device is failed or a function of the tester is deteriorated through the cable.

In order to solve the above-described problem, an approach that a semiconductor device to be inspected is set directly on the tester to reduce a length of the cable would be considered. However, such an approach causes any vibration or shock from an air fan of the tester, a floor and the like to be transmitted directly to the semiconductor device, to thereby render observation of the semiconductor device through a microscope highly difficult or substantially impossible. Further, when the inspection table is not provided with an effective vibration-proof structure, the vibration or shock is transmitted also to the inspection table or its peripheral equipments, to thereby cause the inspection needle of the positioner to be vibrated, leading to a failure in probing the semiconductor device.

SUMMARY OF THE INVENTION

The present invention has been made in view of the foregoing disadvantage of the prior art.

Accordingly, it is an object of the present invention to provide an apparatus for inspecting an internal circuit of a semiconductor device which is capable of accurately and positively inspecting an internal circuit of a semiconductor device.

It is another object of the present invention to provide an apparatus for inspecting an internal circuit of a semiconductor device which is capable of accomplishing inspection of a semiconductor device while keeping it isolated from any external vibration or shock.

It is another object of the present invention to provide an apparatus for inspecting an internal circuit of a semiconductor device which is capable of substantially decreasing a distance between a tester and a semiconductor device to be inspected.

It is a further object of the present invention to provide an apparatus for inspecting an internal circuit of a semiconductor device which is capable of ensuring accurate inspection of a semiconductor device by providing a substantially true signal.

It is still another object of the present invention to provide an apparatus for inspecting an internal circuit of a semiconductor device which is capable of eliminating adverse affection due to external vibration or shock.

It is yet another object of the present invention to provide an apparatus for inspecting an internal circuit of a semiconductor device which is capable of accurately probing a finely pitched portion of a semiconductor device.

It is a still further object of the present invention to provide an apparatus for inspecting an internal circuit of a semiconductor device which is capable of eliminating a cable for connecting a tester and an IC socket to each other therethrough to significantly simplify the structure of the apparatus.

In accordance with the present invention, an apparatus for inspecting an internal circuit of a semiconductor device is provided. The apparatus includes a tester, a frame for surrounding the tester, a plurality of air spring structures arranged on the frame and connected to one another through an air piping, an inspection table horizontally supported on the air spring structures and mounted thereon with an inspection equipment, an interface board horizontally arranged above the tester while being kept electrically contacted with the tester, and a socket-equipped board arranged above the interface board while being kept electrically contacted with the interface board and mounted on the inspection table.

In a preferred embodiment of the present invention, the air spring structures are arranged on the frame in a positionally equal manner. Four air spring structures may be arranged on corners of the frame, respectively.

In a preferred embodiment of the present invention, the inspection table is formed into a substantially U-shape in plan.

In a preferred embodiment of the present invention, the tester includes a head and the interface board is supported above the head of the tester.

In a preferred embodiment of the present invention, the socket-equipped board is detachably mounted on the inspection table.

In a preferred embodiment of the present invention, the apparatus further comprises at least one automatic equilibrium position controlling unit arranged at the air piping.

In a preferred embodiment of the present invention, the interface board and socket-equipped board are electrically contacted to each other through leads. The leads each may be formed into a substantially S-shape.

In a preferred embodiment of the present invention, the inspecting apparatus may further comprise an additional interface board arranged so as to support said socket-equipped board thereon.

BRIEF DESCRIPTION OF THE DRAWINGS

These and other objects and many of the attendant advantages of the present invention will be readily appreciated as the same becomes better understood by reference to the following detailed description when considered in connection with the accompanying drawings in which like reference numerals designate like or corresponding parts throughout; wherein:

FIG. 7 is a fragmentary front elevation view generally showing another embodiment of an apparatus for inspecting an internal circuit of a semiconductor device according to the present invention.

DETAILED DESCRIPTION OF THE PREFERRED EMBODIMENTS

Now, an apparatus for inspecting an internal circuit of a semiconductor device according to the present invention will be described hereinafter with reference to the accompanying drawings.

Figure 1:
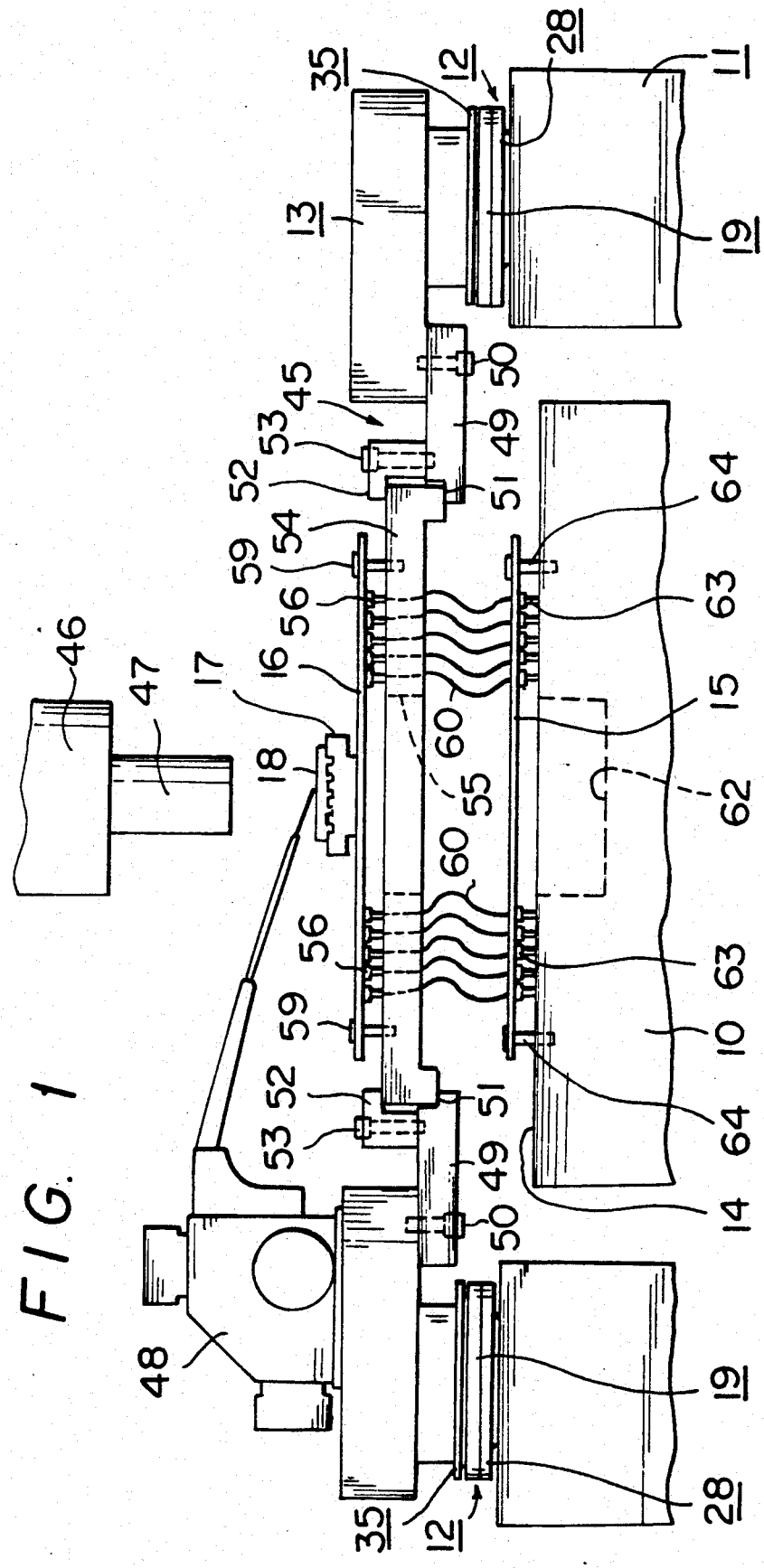
FIG. 1 is a fragmentary front elevation view schematically showing an embodiment of an apparatus for inspecting an internal circuit of a semiconductor device according to the present invention.
Figure 2:
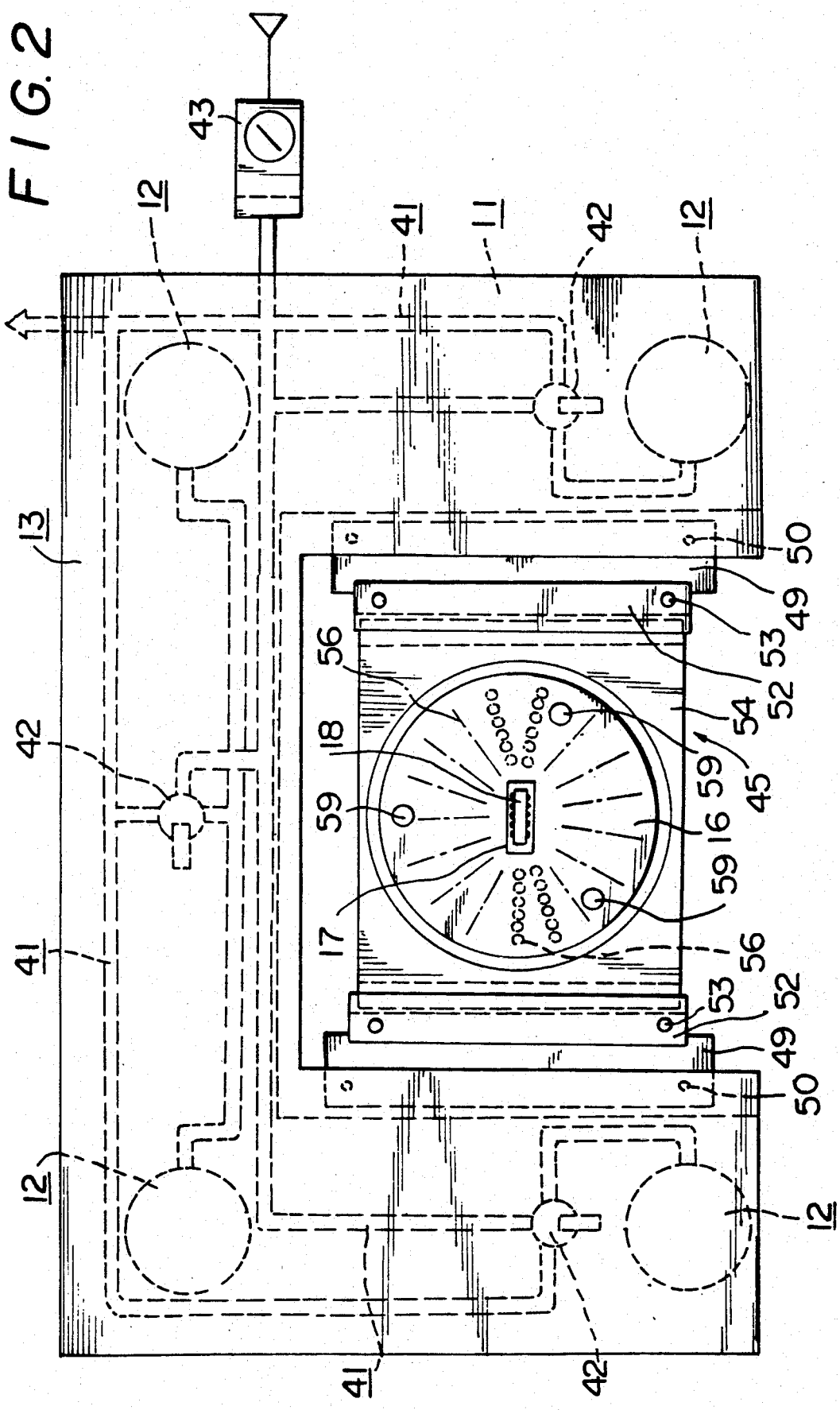
FIG. 2 is a fragmentary schematic plan view of the inspecting apparatus shown in FIG. 1.

FIGS. 1 and 2 schematically illustrates an embodiment of an apparatus for inspecting an internal circuit of a semiconductor device according to the present invention.

An inspecting apparatus of the illustrated embodiment generally includes a tester 10, a frame 11 for surrounding the tester 10, a plurality of air spring structures 12 arranged on the frame 11 and fluid-communicating with each other, an inspection table 13 horizontally supported on the air spring structures 12, an interface board 15 horizontally arranged above the tester 10 while being kept electrically contacted with the tester 10, and a socket-equipped board 16 including a socket 17 which is arranged above the interface board 15 while kept electrically contacted with the interface board 15 and mounted on the inspection table 13. The air spring structures 12 are preferably arranged on the frame 11 in a positionally equal manner. In the illustrated embodiment, four air spring structures 12 are arranged on four corners of the frame 11, respectively. Also, in the illustrated embodiment, the tester 10 includes a head 14, above which the socket-equipped board 16 is supported, and the socket-equipped board 16 is detachably mounted on the inspection table 13.

The tester 10 is adapted to operate or examine an internal circuit of a semiconductor device 18 to be inspected and may be constructed in such a manner widely known in the art.

Figure 4:
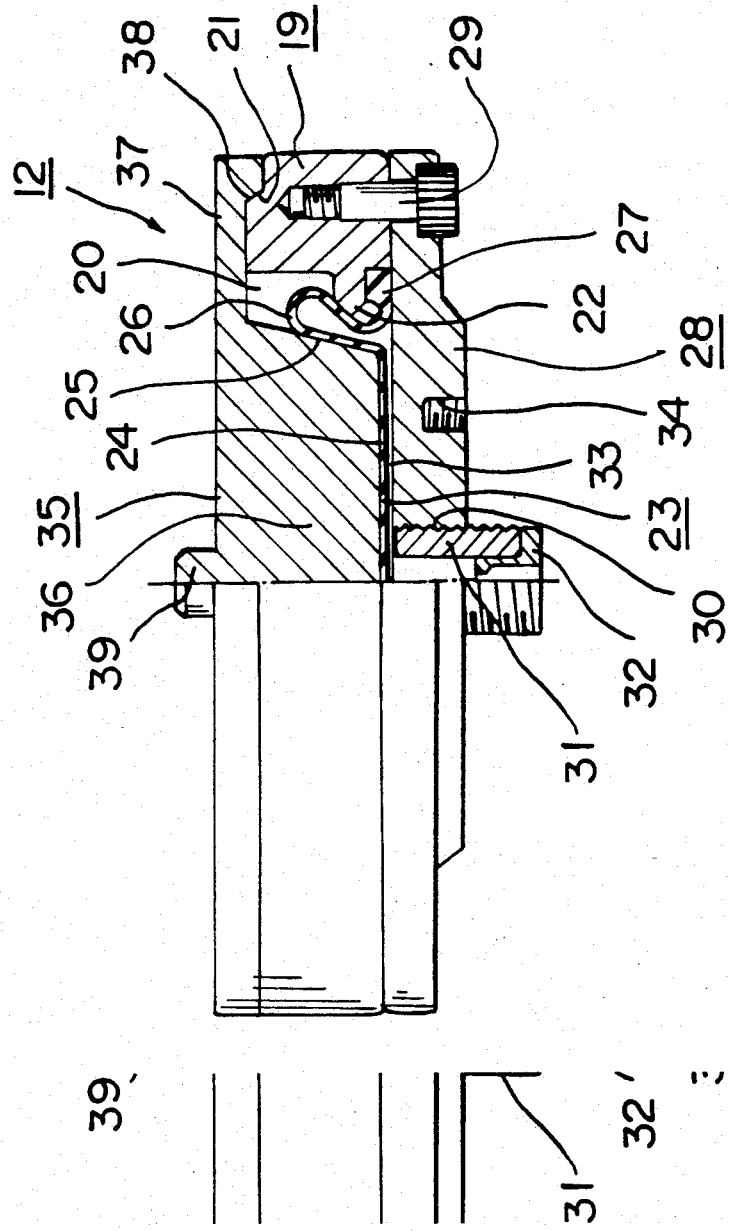
FIG. 4 is a front elevation view half in section of the air spring structure shown in FIG. 3.
Figure 5:
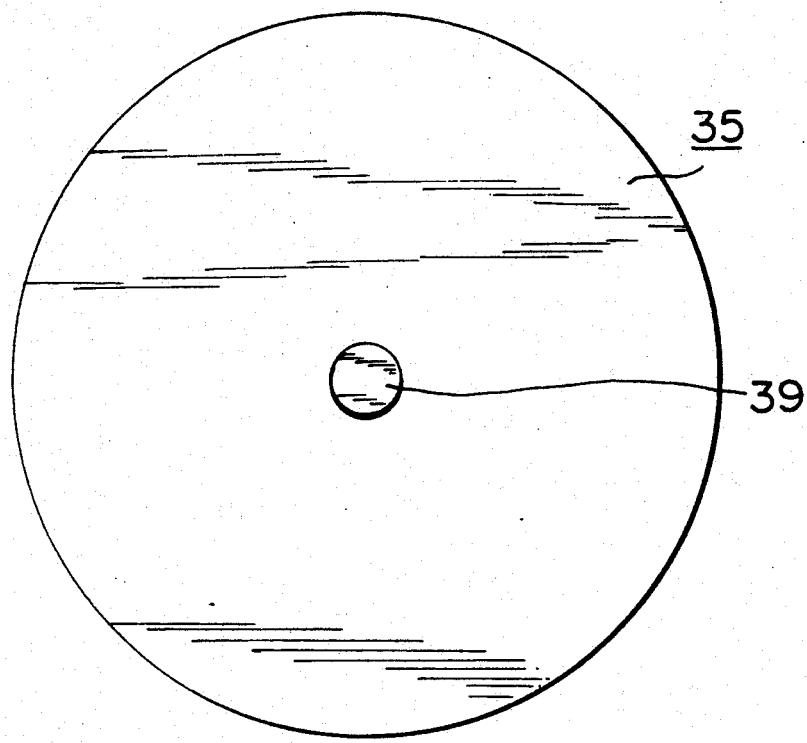
FIG. 5 is a plan view of the air spring structure shown in FIG. 3.

The air spring structures 12 each are provided for absorbing vibration or shock resulting from an air fan of the tester 10, a floor or the like to prevent it from being transmitted to the inspection table 13. For this purpose, each of the air spring structures 12, as shown in FIGS. 4 and 5, may be constructed into, for example, a disc-like diaphragm structure. More specifically, The air spring structures 12 each include a flange 19, a diaphragm 23, an air spring seat 28, a core 35 and the like, which will be more detailedly described hereinafter.

Figure 3:
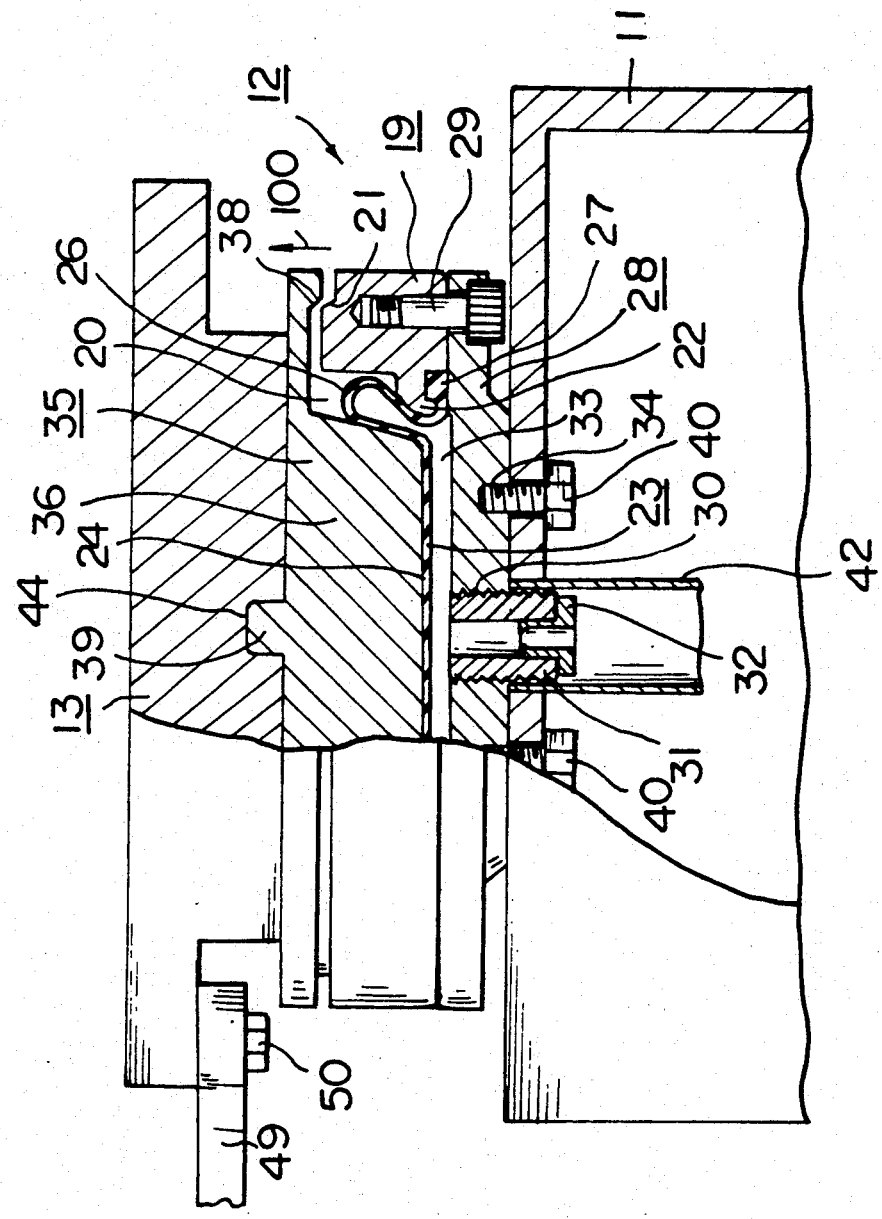
FIG. 3 is a fragmentary enlarged front elevation view partly in section showing mounting of an air spring structure.

The flange 19, as shown in FIGS. 3 and 4, is formed into a substantially donut-like shape, resulting in being provided at a central portion thereof with a circular opening 20. The flange 19 is provided at an outer peripheral portion of an upper surface thereof with a step 21, as well as at a lower peripheral portion of an inner surface thereof with a tongue-like projection 22 of which a distal end is downward directed, as shown in FIG. 4. Further, in the circular opening 20 of the flange 19 is arranged a diaphragm 23.

The diaphragm 23 includes a flat bottom portion 24 arranged at a lower portion of the opening 20 of the flange 19, an inner rising portion 25 formed contiguous to the bottom portion 24 and in a manner to be somewhat outwardly enlarged, a curved outer rising portion 26 contiguous to the inner rising portion 25 and an outer end portion 27 of an increased thickness formed contiguous to a lower end of the outer rising portion 26, which are integrally formed. A part of the curved outer rising portion 26 of the diaphragm 23 is engaged with the tongue-like projection 22 of the flange 19 together with the outer end portion 27 of the diaphragm 23, so that the diaphragm 23 may be securely arranged in the opening 20 of the flange 19. On a lower surface of the flange 19 is securely mounted an air spring seat 28 through four mounting positions by means of bolts 29 in a manner to define a space 33 between the diaphragm 23 and the air spring seat 28, so that the air spring seat 28 cooperates with the tongue-like projection 22 to airtightly seal the outer end portion 27 of the diaphragm 23. The air spring seat 28 is formed at a central portion thereof with a threaded through-hole 30, in which a nipple 31 including an orifice 32 is threadedly fitted, so that air may be introduced through the nipple 31 into the space 33 defined between the diaphragm 23 and the air spring seat 28. The air spring seat 28 is also formed with four threaded holes 34 through which the air spring seat 28 is threadedly fixed on the frame 11 by means of bolts 40.

The core designated at reference numeral 35 is formed into a circular shape in plan and includes a thick-walled portion 36 of an inverted frust-conical shape in section fitted in a substantially U-shaped recess defined by the bottom portion 24 and inner rising portion 25 of the diaphragm 23 and a flange-like thin-walled outer peripheral portion 37 contiguous to the thick-walled portion 36. The outer peripheral portion 37 of the core 35 is formed on a lower surface of an outer peripheral end thereof with a projection 38 in a manner to correspond in position and shape to the step 21 of the flange 19. Also, the core 35 is provided on an upper surface of a central position thereof with a post-like projection 39 of a small height, which is fitted in a recess 44 provided on a surface of the inspection table 13 opposite to the core 35, as described hereinafter. Thus, the core 35 is so arranged that the thick-walled portion 36 is fitted in the central section of the diaphragm and the outer peripheral portion 38 is integrally engaged with the step 21 of the flange 19, resulting in providing the air spring structure 12. In the illustrated embodiment, the air spring structures 12 thus constructed, as shown in FIGS. 2 and 3, are arranged on the four corners of the frame 11 and fixedly mounted thereon by upward threadedly inserting bolts 40 into the threaded holes 34 of the air spring seats 28 through the frame 11.

Four such air spring structures 12, as shown in FIGS. 2 and 3, are connected to one another through an air piping 41 arranged in the frame 11 and connected to the nipple 31 of the air spring structures 12. Also, the air spring structures 12 are connected to at least one automatic equilibrium position controlling sensors (limit valve) 42. In the illustrated embodiment, three such automatic equilibrium position controlling sensors 42 are arranged. The piping 41 is connected on a feed side thereof to an air feed adjusting unit 43, as shown in FIG. 2.

In the operation of the apparatus of the illustrated embodiment, air which is fed from the air feed adjusting unit 43 to the piping 41 is then introduced through the orifice 32 of each of the air spring structures 12 into the space 33, as shown in FIG. 3. This causes a pressure in the space 33 to be gradually increased, to thereby expand the diaphragm 23, so that the core 35 is caused to float by a distance of, for example, 2 to 3 mm in a direction of an arrow indicated at reference numeral 100 in FIG. 3. The pressures in the spaces 33 of the air spring structures 12 are automatically controlled through the three automatic equilibrium position controlling sensors 42 so as to be kept at a predetermined equal level, so that the inspection table 13 arranged on the air spring structures 12 may be kept horizontal while being maintained vibration-proof. The inspection table 13 is stationarily placed on the cores 35 of the air spring structures 12 while being kept horizontal by fitting the projections 39 of the cores 35 in the recesses 44 formed on a lower surface of the inspection table 13.

The inspection table 13, as shown in FIGS. 1 and 2, is formed into a substantially U-shape in plan, resulting in provided with a rectangular cutout 45. On an upper surface of the inspection table 13 are mounted an inspection equipment such as a microscope 46 of high magnification including an objective lens 47, a positioner 48 or the like.

The inspection table 13 is securely mounted on sides thereof opposite to each other through the cutout 45 with a pair of arm plates 49 by means of bolts 50, as shown in FIG. 2. The arm plates 49 each are provided on a free end thereof extending in a longitudinal direction thereof with an L-shaped cutout 51, as shown in FIG. 1. Also, the arm plates 49 each are mounted on an upper surface thereof with a clamp plate 52 of an inverted L-shape by means of clamp bolts 53 so as to extend in the longitudinal direction of the arm plate 49, so that the clamp plate 52 and the L-shaped cutout 51 of the arm plate 49 cooperate with each other to clamp each of side edges of an interface board 54, to thereby keep the interface board 54 horizontal.

The interface board 54 is formed at a central portion thereof with a circular opening 55. The board 16 equipped with the socket 17 would be often provided on a rear surface thereof with an electronic component (not shown). The opening 55 is arranged for the purpose of preventing the circuit element from colliding with the board 16. The interface board 54 is provided thereon with a number of spring pins 56 in a manner to be arranged on a periphery of the opening 55 of the interface board 54 and radially extend in rows, as shown in FIGS. 2 and 6.

In FIG. 2, for the sake of brevity, only the spring pins 56 of one row arranged so as to extend in a radial direction of the opening 55 are indicated at dotted lines and the remaining spring pins 56 are schematically indicated at dashed lines.

Figure 6:
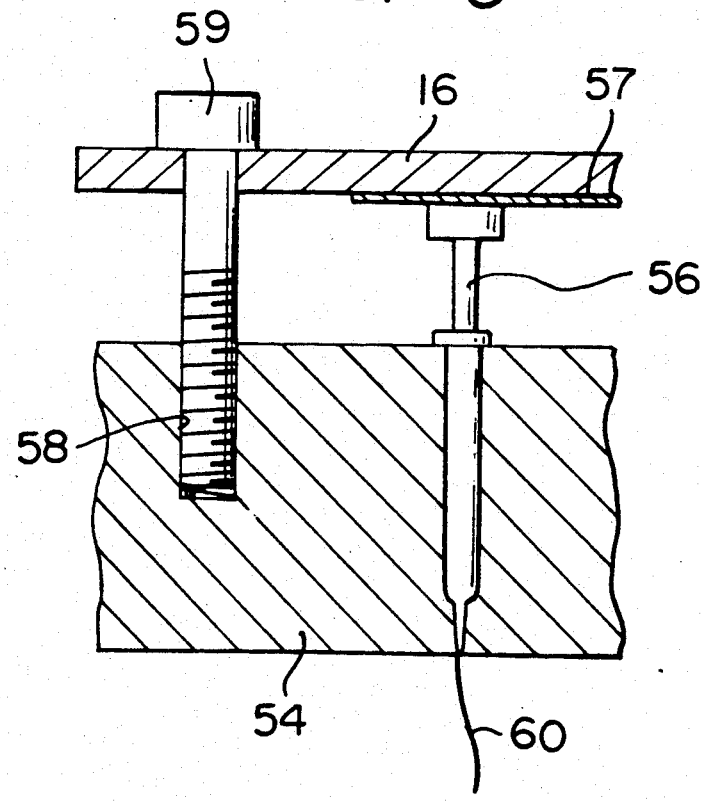
FIG. 6 is a fragmentary enlarged sectional view showing a support structure for a board equipped with a socket.

As shown in FIGS. 2 and 6, above the interface board 54 is horizontally arranged the board 16 of a disc-like shape equipped with the socket 17 in such a manner that patterns 57 printed on a rear surface of the board 16 is kept electrically contacted with the spring pins 56. For this purpose, the board 16 is horizontally supported above the interface board 54 by means of a plurality of screws 59 threadedly inserted into threaded holes 58 of the interface board 54 through the board 16. In the illustrated embodiment, three such screws 59 are fitted in three such threaded holes 58 of the interface board 54, respectively, and it is a matter of course that the fitting of the screws 59 in the threaded holes 58 is carried out at positions which do not interfere with the spring pins 56. The socket 17 of the board 16 is arranged on a central portion of an upper surface of the board 16 while being kept electrically contacted with the patterns 57 and the semiconductor device 18 to be inspected is set on the socket 17 in a manner to be electrically contacted with the socket 17, so that an internal circuit of the semiconductor device 18 may be inspected through the inspection equipment such as the positioner 48 or the like.

The spring pins 56 each are electrically connected through each of leads 60 to patterns (not shown) printed on the interface board 15 horizontally arranged above the head 14 of the tester 10. The leads 60 each are preferably formed into a length as small as possible so as to permit a signal generated from the tester 10 or the like to be properly transmitted therethrough. Also, each of the leads 60 is preferably formed into a substantially S-shape to minimize transmission of vibration or shock therethrough from the tester 10 or the like to the interface board 54.

The interface board 15 is horizontally arranged above the head 14 of the tester 10 while the patterns on the interface board 15 are kept electrically contacted with a number of spring pins 63 provided on the head 14 of the tester 10 in a manner to be arranged on a periphery of a recess 62 formed on a central portion of the head 14 and radially extend in rows. The horizontal arrangement of the interface board 15 above the head 14 of the tester 10 is carried out by threadedly inserting a plurality of screws 64 through the interface board 15 into threaded holes (not shown) formed at the tester 10 in substantially the same manner as the threaded holes 58 (FIG. 6) of the interface board 15, respectively. In the illustrated embodiment, three such screws 64 are fitted in three such threaded holes of the tester 10, respectively, and the fitting of the screws 59 in the threaded holes 58 is carried out at positions which do not interfere with the spring pins 63.

Now, the manner of operation of the apparatus of the illustrated embodiment described above will be described hereinafter.

The semiconductor device 18 to be inspected is set on the socket 17 and the tester 10 is actuated, so that the internal circuit of the semiconductor device 18 is inspected through the inspection equipment such as the high-magnification microscope 46, the positioner 48 or the like. During the inspection, the inspection table 13 cooperates with the air spring structures 12 provided at the four corners thereof, as well as the air piping 41 and automatic equilibrium position controlling sensors 42 associated with the air spring structures 12 to function as a vibration-proof means, so that the semiconductor device 18 set on the inspection table 13 through the interface board 54 and the socket-equipped board 16 may be effectively isolated from vibration or shock resulting in from a floor, the tester 10 and the like.

More specifically, air fed from the air feed adjusting unit 43 is introduced through the air piping 41 and the orifices 32 of the air spring structures 12 into the spaces 33 each defined between the diaphragm 23 and the air spring seat 28. This causes a pressure in each of the spaces 33 to be increased to a predetermined level to expand the diaphragm, resulting in the core 35 floating from the flange 19 to act as an air spring. Floating of the cores 35 causes the inspection table 13 supported on the cores 35 to be upward moved together with the inspection equipment supported on the inspection table 13 and the boards mounted thereon, so that the whole inspection table 13 may function as a vibration-proof means for preventing vibration or shock generated from the tester 10 or the like from being transmitted to the semiconductor device 18 to be inspected. Further, the interface board 15 on the tester 10 is merely connected through the leads 60 of a substantially S-shape to the interface board 54 arranged above the interface board 15, therefore, vibration from the tester 10 transmitted through the leads 60 to the interface board 54 is restricted to a degree sufficient to permit a finely pitched portion of the semiconductor device 18 to be properly probed.

The pressure in each of the air spring structures 12 is automatically controlled through a detection means comprising the three automatic equilibrium position controlling sensors 42 so as to be held at a predetermined equal level, so that the inspection table 13 may be horizontally maintained while being kept vibration-proof.

Thus, the inspecting apparatus of the illustrated embodiment permits the inspection table 13 having the inspection equipments such as the microscope 46, the positioner 8 or the like mounted thereon to function also as a vibration-proof means in cooperation with the air spring structures 12, so that vibration or shock generated from the tester 10, a floor or the like may be effectively absorbed by the air spring structures 12 to prevent the vibration or shock from adversely affecting the semiconductor device 18 to be inspected, resulting in ensuring accurate inspection of the internal circuit of the semiconductor device 18.

In addition, the interface boards 15 and 54 arranged so as to be vertically spaced from each other are electrically connected through the leads to each other while being kept mechanically independent from each other, so that the vibration or shock transmitted from the tester 10 or the like to the semiconductor device 18 is minimized to a degree sufficient to be prevented from adversely affecting the inspection, because it is transmitted though only the leads 60 each formed into a substantially S-shape. Further, a distance between the inspection equipment and the tester 10 is substantially decreased to ensure that a signal generated by the equipment is fed to the tester while being kept substantially true. Thus, it will be noted that the inspecting apparatus of the illustrated embodiment permits the finely pitched portion of the semiconductor device to be properly probed.

Referring now to FIG. 7 showing another embodiment of an apparatus for inspecting an internal circuit of a semiconductor device according to the present invention, an inspecting apparatus of the illustrated embodiment is so constructed that when only a socket-equipped board 200 including a socket 17 is arranged, the socket-equipped board 200 and an interface board 15 provided above a tester 10 are electrically connected through leads 60 to each other without such a support interface board as required for supporting the socket-equipped board 16 in the embodiment shown in FIGS. 1 to 6 and designated at reference numeral 54. Thus, a semiconductor device 18 to be inspected is set on the socket 17, resulting in being subject to inspection. The socket-equipped board 200 may be constructed in substantially the same manner as that in the above-described embodiment.

More particularly, the board 200 equipped with the socket 17 has patterns (not shown) printed thereon, which are electrically connected directly to patterns (not shown) on the interface board 15 through leads 60 of a substantially S-shape. The board 200 equipped with the socket 17 is horizontally supported by securely interposing both sides of the board 200 between a pair of substantially L-shaped arm plates 201 mounted on both sides of a cutout 45 of an inspection table 13 opposite to each other and a pair of clamp plates 52 arranged on the arm plates 201 so as to extend in a longitudinal direction of the arm plates 201 by means of clamp bolts 53. The remaining part of the illustrated embodiment may be constructed in substantially the same manner as the embodiment described above with reference to FIGS. 1 to 6. Thus, it will be noted that the inspecting apparatus of the illustrated embodiment may be operated in substantially the same manner as the above-described embodiment.

The above-described construction of the illustrated embodiment permits a support interface board for horizontally supporting the board equipped with the socket and a number of spring pins associated with the support interface board to be eliminated, to thereby decrease a number of parts and simplify a structure of the inspecting apparatus.

While preferred embodiments of the invention have been described with a certain degree of particularity with reference to the drawings, obvious modifications and variations are possible in light of the above teachings. It is therefore to be understood that within the scope of the appended claims, the invention may be practiced otherwise than as specifically described.

What is claimed is:

1. An apparatus for inspecting an internal circuit of a semiconductor device comprising:
   a tester;
   a frame for surrounding said tester;
   a plurality of air spring structures arranged on said frame and connected to one another through an air piping, said air spring structures being arranged on corners of said frame, respectively;
   an inspection table horizontally supported on said air spring structures and mounted thereon with an inspection equipment;
   an interface board horizontally arranged above said tester while being kept electrically contacted with said tester; and
   a socket-equipped board arranged above said interface board while being kept electrically contacted with said interface board and mounted on said inspection table.

2. An apparatus as defined in claim 1, wherein said air spring structures are arranged on said frame in a positionally equal manner.

3. An apparatus for inspecting an internal circuit of a semiconductor device comprising;
a tester;
a frame for surrounding said tester;
a plurality of air spring structures arranged on said frame and connected to one another through an air piping, said inspection table being formed in a substantially U-shape in plan;
an inspection table horizontally supported on said air spring structures and mounted thereon with an inspection equipment;
an interface board horizontally arranged above said tester while being kept electrically contacted with said tester; and
a socket-equipped board arranged above said interface board while being kept electrically contacted with said interface board and mounted on said inspection table.

4. An apparatus as defined in claim 3, wherein said tester includes a head;
said interface board being supported above said head of said tester.

5. An apparatus as defined in claim 3, wherein said socket-equipped board is detachably mounted on said inspection table.

6. An apparatus for inspecting an internal circuit of a semiconductor device comprising;
a tester;
a frame for surrounding said tester;
a plurality of air spring structures arranged on said frame and connected to one another through an air piping;
at least one automatic equilibrium position controlling unit arranged at said air piping;
an inspection table horizontally supported on said air spring structures and mounted thereon with an inspection equipment;
an interface board horizontally arranged above said tester while being kept electrically contacted with said tester; and
a socket-equipped board arranged above said interface board while being kept electrically contacted with said interface board and mounted on said inspection table.

7. An apparatus as defined in claim 6, wherein said interface board and socket-equipped board are electrically contacted to each other through leads.

8. An apparatus as defined in claim 7, wherein said leads each are formed into a substantially S-shape.

9. An apparatus as defined in claim 7, further comprising an additional interface board arranged so as to support said socket-equipped board thereon.

* * * * *